(12) United States Patent
Resch (10) Patent No.: US 9,996,283 B2
(45) Date of Patent: Jun. 12, 2018

(54) HANDLING STORAGE UNIT LATENCY IN A DISPERSED STORAGE NETWORK

(71) Applicant: International Business Machines Corporation, Armonk, NY (US)

(72) Inventor: Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 130 days.

(21) Appl. No.: 15/224,118

(22) Filed: Jul. 29, 2016

(65) Prior Publication Data

US 2017/0060454 A1    Mar. 2, 2017

Related U.S. Application Data

(60) Provisional application No. 62/211,975, filed on Aug. 31, 2015.

(51) Int. Cl.
*G06F 3/06* (2006.01)
*G06F 11/10* (2006.01)
(Continued)

(52) U.S. Cl.
CPC ............ *G06F 3/0619* (2013.01); *G06F 3/064* (2013.01); *G06F 3/067* (2013.01); *G06F 3/0611* (2013.01); *G06F 3/0622* (2013.01); *G06F 3/0637* (2013.01); *G06F 3/0644* (2013.01); *G06F 3/0659* (2013.01); *G06F 3/0665* (2013.01);
(Continued)

(58) Field of Classification Search
CPC .... G06F 3/0619; G06F 3/0611; G06F 3/0622; G06F 3/0637; G06F 3/064; G06F 3/0644; G06F 3/0659; G06F 3/067
See application file for complete search history.

(56) References Cited

U.S. PATENT DOCUMENTS 4,092,732 A    5/1978 Ouchi
5,454,101 A    9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Ryan Bertram
(74) *Attorney, Agent, or Firm* — Garlick & Markison; Timothy W. Markison; Bruce E. Stuckman (57) ABSTRACT

A method for execution by a dispersed storage and task (DST) processing unit includes generating storage unit performance data based on a performance threshold value and storage unit performance values of storage units in a storage unit write set. Storage unit write set data indicating a new storage unit write set based on the storage unit performance data is generated, where at least one slow-performing storage unit is removed from the storage unit write set to create the new storage unit write set when the at least one slow-performing storage unit has a storage unit performance value that compares unfavorably to the performance threshold value. A plurality of write requests are generated for transmission to the new storage unit write set via a network, each including a data slices to be written to a corresponding storage unit of the new storage unit write set.

18 Claims, 7 Drawing Sheets

(51) Int. Cl.
| | |
|---|---|
| *G06F 12/14* | (2006.01) |
| *H04L 29/08* | (2006.01) |
| *G06F 11/30* | (2006.01) |
| *G06F 11/34* | (2006.01) |
| *H03M 13/15* | (2006.01) |

(52) U.S. Cl.
CPC ........ *G06F 3/0689* (2013.01); *G06F 11/1076* (2013.01); *G06F 11/1092* (2013.01); *G06F 11/3034* (2013.01); *G06F 11/3409* (2013.01); *G06F 12/1408* (2013.01); *H04L 67/1097* (2013.01); *G06F 2212/1052* (2013.01); *H03M 13/1515* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Saran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2015/0220396 A1* | 8/2015 | Shirley, Jr. ............... G06F 3/06 714/6.23 |
| 2015/0234708 A1* | 8/2015 | Storm ................ G06F 11/1076 714/6.22 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working—Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Confer- (56) References Cited

OTHER PUBLICATIONS ence on Architectural Support for Programming Languages and Operating Systems (ASPLOS 2000); Nov. 2000; pp. 1-12.

* cited by examiner

HANDLING STORAGE UNIT LATENCY IN A DISPERSED STORAGE NETWORK

CROSS-REFERENCE TO RELATED APPLICATIONS

The present U.S. Utility Patent Application claims priority pursuant to 35 U.S.C. § 119(e) to U.S. Provisional Application No. 62/211,975, entitled "STORING ENCODED DATA SLICES IN A DISPERSED STORAGE NETWORK", filed Aug. 31, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

DETAILED DESCRIPTION OF THE INVENTION

Figure 1:
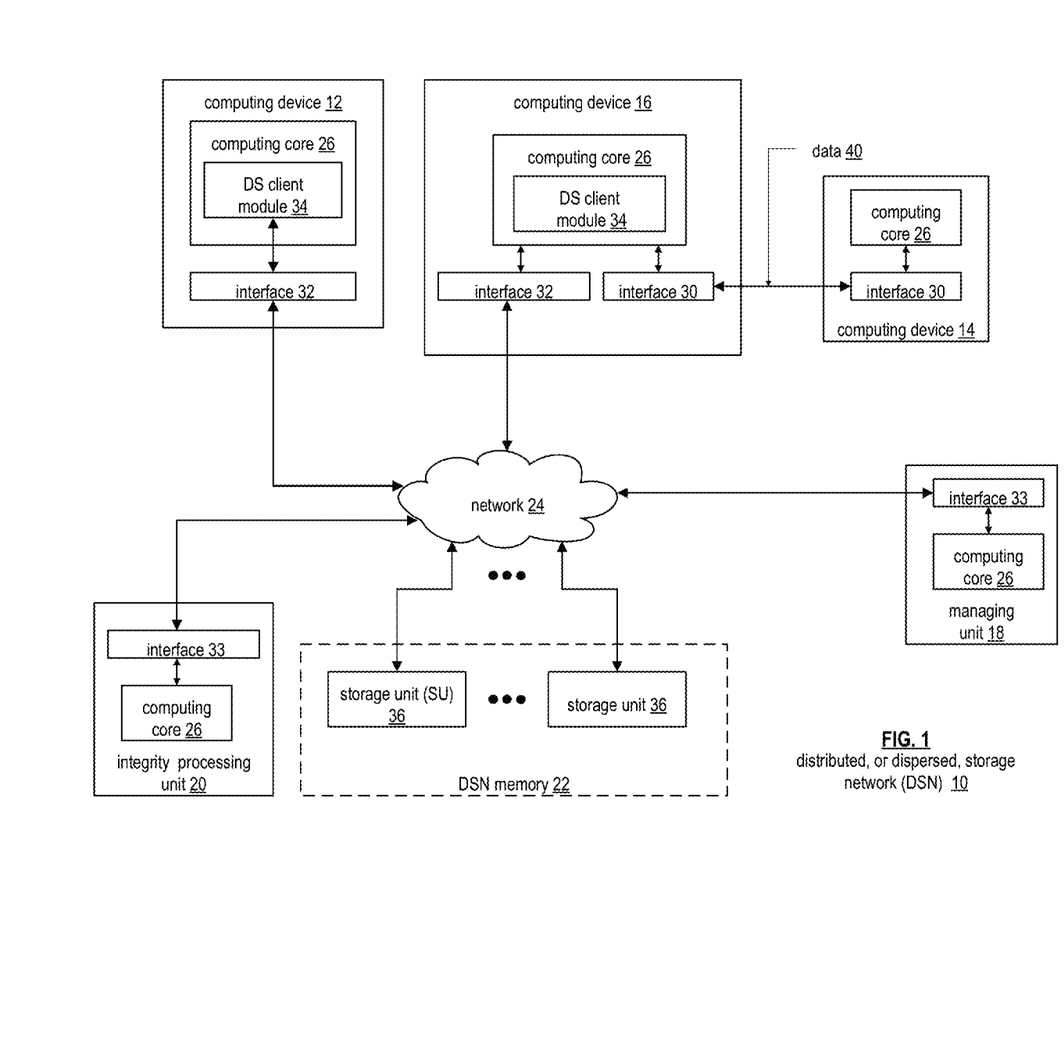
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
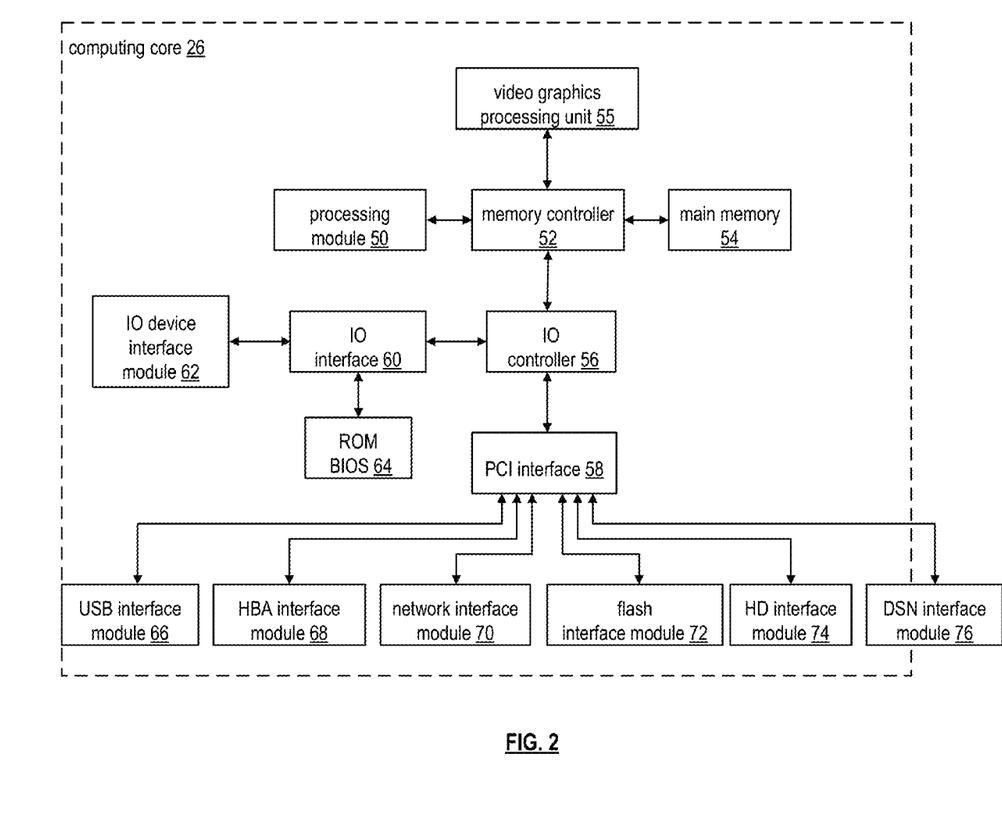
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the 10 device interface module 62 and/or the memory interface modules 66-76 may be collectively or individually referred to as 10 ports.

Figures 3, 4, 5:
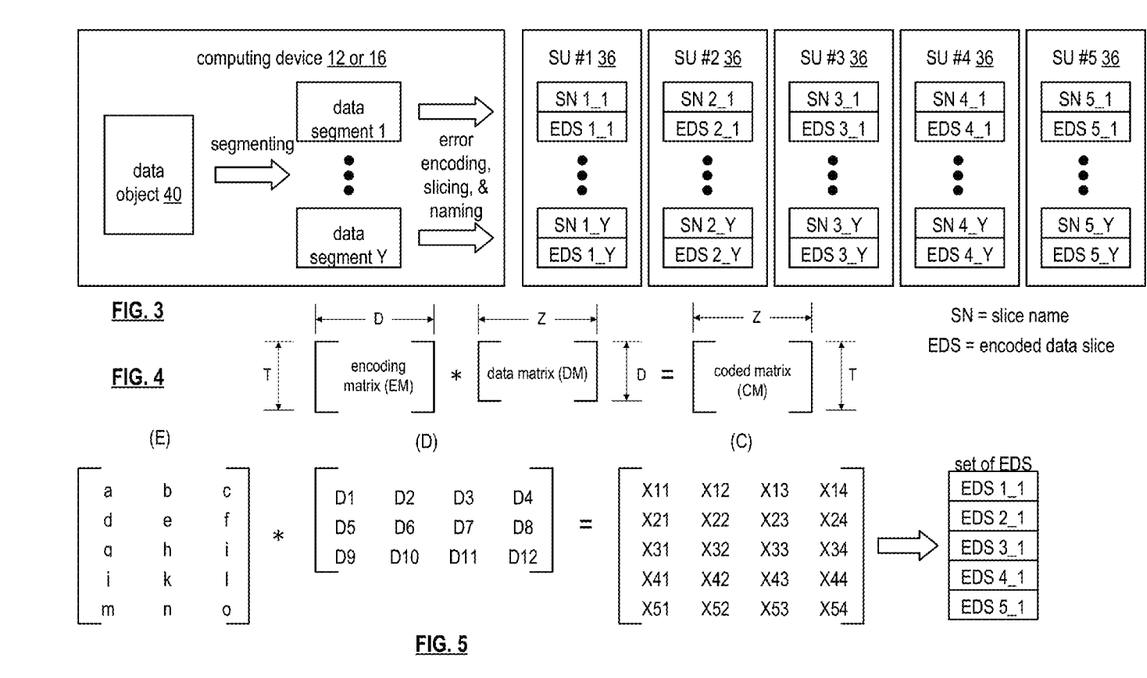
FIG. 3 is a schematic block diagram of an example of dispersed storage error encoding of data in accordance with the present invention.
FIG. 4 is a schematic block diagram of a generic example of an error encoding function in accordance with the present invention.
FIG. 5 is a schematic block diagram of a specific example of an error encoding function in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS $1_{\_1}$), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
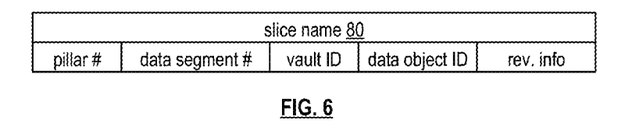
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through ED 5_Y and the last set of slice names includes SN 1_Y through SN 5_Y.

Figure 7:
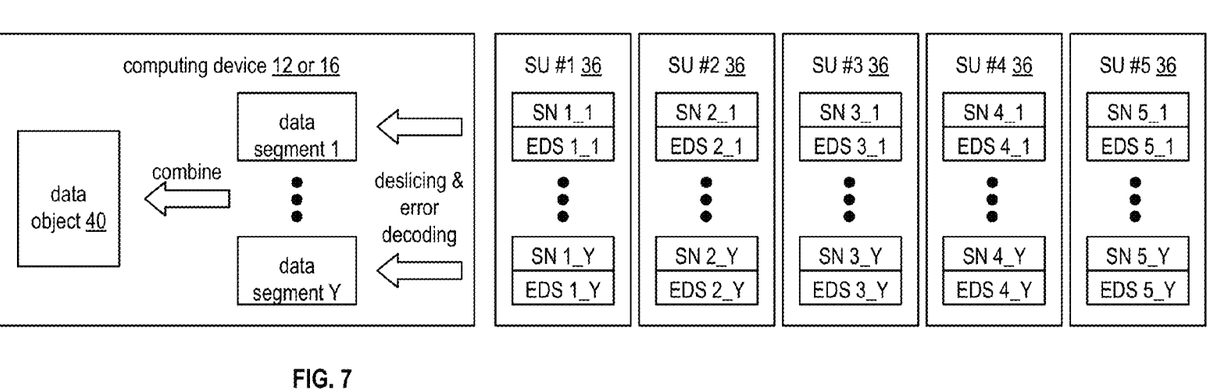
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
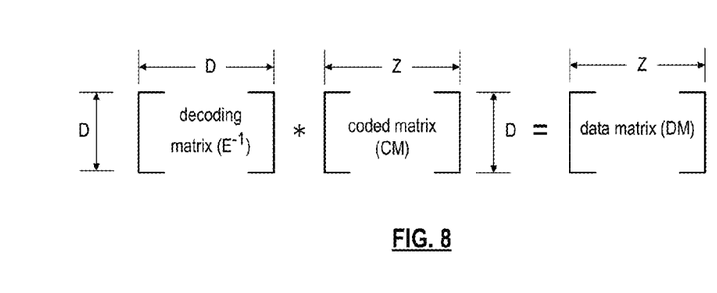
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
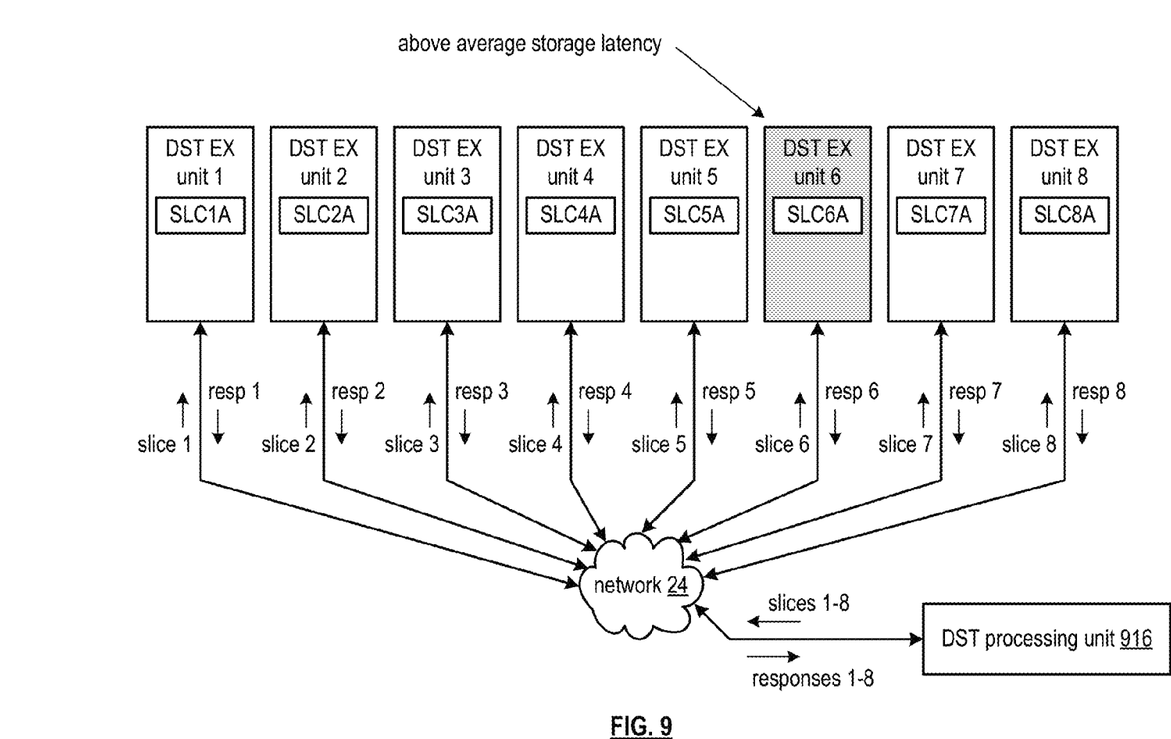
FIG. 9 is a schematic block diagram of an embodiment of a dispersed or distributed storage network (DSN) in accordance with the present invention.

FIG. 9 is a schematic block diagram of another embodiment of a dispersed storage network (DSN) that includes a DST processing unit 916, the network 24 of FIG. 1, and a plurality of storage units functioning as DST execution (EX) units 1-8. Note that any number of storage units could be included. The DST processing unit 916 can include the interface 32 of FIG. 1, the computing core 26 of FIG. 1, and the DS client module 34 of FIG. 1. The DST processing unit 916 can be implemented utilizing the computing device 16 of FIG. 1, functioning as a dispersed storage processing agent for computing device 14 as described previously. Each storage unit may be implemented utilizing the storage unit 36 of FIG. 1, and may interchangeably be referred to as a DST execution unit as discussed previously. The DSN functions to handle storage unit latency.

When a DST processing unit is performing writes to a set of storage units, it may encounter one or more storage units which are taking longer to process the request than the others, potentially holding up the operation. This can lead to a determination by the DST processing unit of whether to slow down and wait for the slow store, or whether to resend slices to alternate locations (in a Trimmed Writes scenario). Since both of these conditions will require rebuilding to recover, the threshold for deciding to drop slices/write to non-optimal locations should have a high bar for being crossed, as otherwise the rebuilder may slow down things even more. In various embodiments, once that line is crossed, the bar can be dropped for making the decision for any other slices of that source because, while it is very expensive to rebuild a single slice of a source (requiring a threshold number of reads) the marginal increase in cost to rebuild multiple slices of that source is low (after rebuilding all slices can be produce freely without additional reads). For example, when writing a source to 10 stores, 1 of which is very slow and 2 of which are somewhat slow, if the very slow store crosses the line to drop/re-write its slice elsewhere (requiring a rebuild to recover), that can lower the bar such that the slices for the somewhat slow stores are also dropped/written elsewhere. Therefore, the DST processing unit can use this information to more optimally and intelligently decide which slices to drop/give up on, knowing that once it's been done for any slice, there's little extra rebuilding impact to drop/give up on other slices of that source.

In an example of operation of the storing of the encoded data slices shown in FIG. 9, for each encoded data slice of a next set of encoded data slices of a plurality of sets of encoded data slices for storage, the DST processing unit 916 can determine whether to skip writing the encoded data slice based on a comparison of an associated storage unit performance level to a performance threshold level. The determining can include one or more of obtaining the associated storage unit performance level (e.g., interpreting a query response, interpreting a test result), obtaining the performance threshold level (e.g., interpreting system registry information, generating the performance threshold level based on previous performance levels), performing the comparison, interpreting comparison results, and/or indicating to skip the writing when the comparison is unfavorable (e.g., indicate to skip the writing when the associated storage unit performance level is less than the performance threshold level), and indicating to perform the writing when the comparison is favorable. For example, a favorable comparison can include instances where a storage unit's performance level is above a performance level threshold, and/or where a storage unit's latency time is below a latency threshold level, and accordingly an unfavorable comparison can include instances where a storage unit's performance level is below a performance level threshold and/or where a storage unit's latency time is above a latency threshold level. For example, the DST processing unit 916 determines that DST execution unit 6 associated with an above average storage latency level but the associated storage unit 6 performance level compares favorably to the performance threshold level and as such, no skipping of the writing of a slice 6 to the storage unit 6 is indicated. The DST processing unit can create a new slice set, or a next set of slices that includes only the slices that will be written, not skipped, and accordingly can create a new storage unit set of corresponding DST execution units that will be written to and not skipped.

In various embodiments, when no skipping is indicated, the DST processing unit 916 can send the next set of slices to the new storage unit set for storage. For example, the DST processing unit 916 sends, via the network 24, encoded data slices 1A-8A to the DST execution units 1-8 and receives responses 1-8 indicating successful storage.

Figure 10:
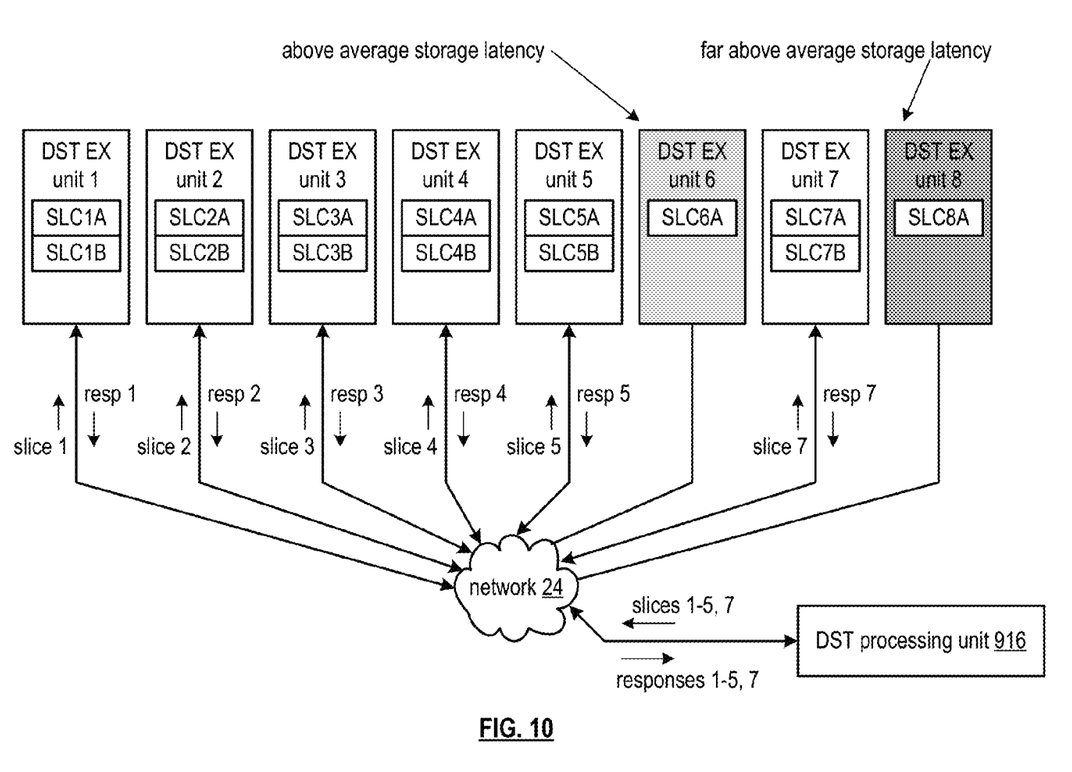
FIG. 10 is a schematic block diagram of another embodiment of a dispersed or distributed storage network (DSN) in accordance with the present invention.

FIG. 10 indicates further steps included in various embodiments of the operation of the storing of the encoded data slices where the DST processing unit 916, for a first encoded data slice of a next set of encoded data slices of the plurality of sets of encoded data slice for storage, determines whether to skip the writing of the encoded data slice based on a comparison of the associated storage unit performance level to the performance threshold level. For example, the DST processing unit indicates to skip the writing of the encoded data slice 8B when the performance level of the DST execution unit 8 compares unfavorably to the performance threshold level.

In various embodiments, when not writing to at least one encoded data slice, the DST processing unit 916 can determine a second performance threshold, which can be created by temporarily updating the performance threshold level, or can be received or generated based on other factors. For example, when not writing encoded data slice 8, the DST processing unit 916 updates the performance threshold level to produce an updated performance threshold level, where the updated performance threshold level is more stringent. For instance, the updated performance threshold level is lowered when the performance threshold level is a measure of access latency to produce a lower maximum access latency performance threshold level.

In various embodiments, having produced the updated performance level, the DST processing unit 916, for each remaining encoded data slice, can determines whether to skip writing of the remaining encoded data slice based on a comparison of the associated storage unit performance level to the second performance threshold level, for example, the updated performance threshold level. For example, the DST processing unit 916 indicates to skip writing encoded data slice 6 when the comparison of the storage units 6 performance level compares unfavorably to the updated performance threshold level (e.g., now it is unfavorable) and the comparison of the performance level of the storage units 1-5, and 7 associated with encoded data slices 1-5, and 7 to the updated performance threshold level is favorable and the encoded data slices 1-5, and 7 includes at least a minimum threshold number of slices (e.g., at least a decode threshold number).

In various embodiments, having determined whether to skip writing of the remaining encoded data slices, the DST processing unit 916 facilitates writing, via the network 24, encoded data slices for storage to the associated storage units. For example, the DST processing unit 916 issues, via the network 24, read slice requests that includes encoded data slices 1B-5B, and 7B to the DST execution units 1-5, and 7. The DST processing unit 916 can receive responses from at least some of the storage units indicating whether corresponding encoded data slices have been stored successfully.

In various embodiments, the DST processing unit can determine the set of storage units that slices will be written to before producing the encoded slices from a data object. The DST processing unit can generate a set of encoded slices based on the number of storage units that will be written to, for example, by applying an encoding function on the data object for storage that takes this value as a parameter. As a result, the number of data slices produced will be equal to the number of storage units to be written to, as indicated based on the performance data, and thus all of the produced data slices will be written to storage.

In various embodiments, the DST processing unit can receive the performance threshold level set the performance threshold level based on interpreting system registry information, or receiving the threshold level as input. In various embodiments, the DST processing unit will generating the performance threshold level itself based on previous performance levels, current system requirements, and/or the performance in previous accesses of the storage units. In various embodiments, the data object for storage will have an associated write urgency, for example, indicated in a write request received by the DST processing unit with the data object, and the performance threshold level can be based on this write urgency. For example, the performance threshold level can be set higher to accommodate a request with a high write urgency. In various embodiments, the updated performance threshold level can also be generated/received based on one or more of these factors.

In various embodiments, a processing system of a dispersed storage and task (DST) processing unit includes at least one processor and a memory that stores operational instructions, that when executed by the at least one processor cause the processing system to generate first storage unit performance data based on a first performance threshold value and a plurality of storage unit performance values corresponding to an original plurality of storage units of an original storage unit write set. Storage unit write set data is generated, indicating a new storage unit write set based on the first storage unit performance data, wherein at least one first slow-performing storage unit is removed from the original storage unit write set to create the new storage unit write set when the first storage unit performance data indicates that the at least one first slow-performing storage unit has an at least one corresponding storage unit performance value that compares unfavorably to the first performance threshold value. A plurality of write requests are generated for transmission to each of the storage units of the new storage unit write set via a network, wherein each write request includes one of a plurality of data slices to be written to a corresponding storage unit of the new storage unit write set.

In various embodiments, generating the storage unit write set data includes creating the new storage unit write set by including all of the storage units of the original storage unit write set when the first storage unit performance data indicates that all of the plurality of storage unit performance values compare favorably to the first threshold performance value. In various embodiments, second storage unit performance data is generated when the at least one first slow-performing storage unit has a corresponding storage unit performance value that compares unfavorably to the first performance threshold value. The second storage unit performance data is based on a second performance threshold value that compares favorably to the first performance threshold value, and further based on the plurality of storage unit performance values. Generating the storage unit write set data further includes removing at least one second slow-performing storage unit from the original storage unit write set to create the new storage unit write set when the second storage unit performance data indicates that the at least one second slow-performing storage unit has an at least one corresponding storage unit value that compares unfavorably to the second performance threshold value. In various embodiments, the at least one corresponding storage unit value the second slow-performing storage unit compares unfavorably to the second performance threshold value and compares favorably to the first performance threshold value.

In various embodiments, the plurality of data slices are generated by performing an encoding function on a data object to be written to storage, wherein a parameter of the encoding function is the size of the new storage unit write set, and wherein the number of data slices generated is equal to the size of the new storage unit write set. In various embodiments, an original plurality of data slices is generated by performing an encoding function on a data object to be written to storage, wherein the number of data slices generated is equal to the size of the original storage unit write set, wherein a subset of the original plurality of data slices to be written to storage is selected based on the new storage unit write set, and wherein the plurality of data slices to be written to corresponding storage units of the new storage unit write set corresponds to the data slices of the subset.

In various embodiments, the plurality of storage unit performance values from the original plurality of storage units of an original storage unit write set via the network. In various embodiments, a plurality of performance data requests are generated, each for transmission to one of the original plurality of storage units of the original storage unit write set via the network, and wherein the plurality of storage unit performance values are received in response to the plurality of performance data requests.

In various embodiments, generating the storage unit write set data is further based on a minimum write threshold, and wherein the size of the new storage unit write set is greater than or equal to the minimum write threshold. In various embodiments, the first storage unit performance data indicates a plurality of first slow-performing storage units with corresponding storage unit performance values that compare unfavorably to the first performance threshold value. A subset of the plurality of first slow-performing storage units is selected to remain in the new storage unit write set, wherein only the storage units of the plurality of first slow-performing storage units that are not included in the subset are removed from the original storage unit write set. The subset is selected based on the minimum write threshold, and the size of the new storage unit write set is equal to the minimum write threshold. In various embodiments, selecting the subset is further based on a ranking of storage unit performance values corresponding to the first plurality of slow-performing storage units.

In various embodiments, the first performance threshold value is selected based on at least one of: current system requirements or a record of past accesses. In various embodiments, the plurality of data slices correspond to a data object, and the first performance threshold value is selected based on a write urgency indicator associated with the data object.

Figure 11:
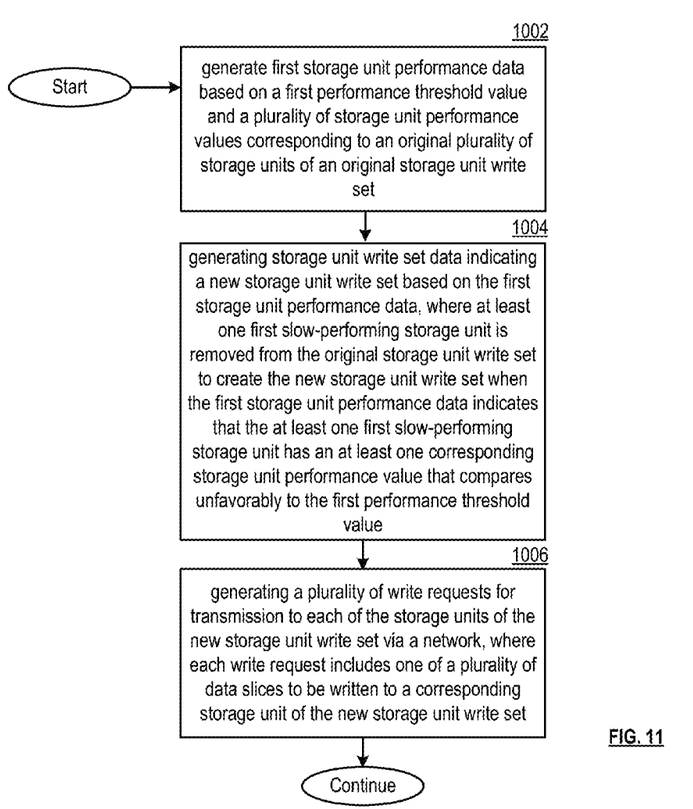
FIG. 11 is a logic diagram of an example of a method of handling storage unit latency in accordance with the present invention.

FIG. 11 is a flowchart illustrating an example of handling storage unit latency. In particular, a method is presented for use in association with one or more functions and features described in conjunction with FIGS. 1-9, for execution by a dispersed storage and task (DST) processing unit that includes a processor or via another processing system of a dispersed storage network that includes at least one processor and memory that stores instruction that configure the processor or processors to perform the steps described below. Step 1002 includes generating first storage unit performance data based on a first performance threshold value and a plurality of storage unit performance values corresponding to an original plurality of storage units of an original storage unit write set. Step 1004 includes generating storage unit write set data indicating a new storage unit write set based on the first storage unit performance data, where at least one first slow-performing storage unit is removed from the original storage unit write set to create the new storage unit write set when the first storage unit performance data indicates that the at least one first slow-performing storage unit has an at least one corresponding storage unit performance value that compares unfavorably to the first performance threshold value. Step 1006 includes generating a plurality of write requests for transmission to each of the storage units of the new storage unit write set via a network, where each write request includes one of a plurality of data slices to be written to a corresponding storage unit of the new storage unit write set.

In various embodiments, generating the storage unit write set data includes creating the new storage unit write set by including all of the storage units of the original storage unit write set when the first storage unit performance data indicates that all of the plurality of storage unit performance values compare favorably to the first threshold performance value. In various embodiments, second storage unit performance data is generated when the at least one first slow-performing storage unit has a corresponding storage unit performance value that compares unfavorably to the first performance threshold value. The second storage unit performance data is based on a second performance threshold value that compares favorably to the first performance threshold value, and further based on the plurality of storage unit performance values. Generating the storage unit write set data further includes removing at least one second slow-performing storage unit from the original storage unit write set to create the new storage unit write set when the second storage unit performance data indicates that the at least one second slow-performing storage unit has an at least one corresponding storage unit value that compares unfavorably to the second performance threshold value. In various embodiments, the at least one corresponding storage unit value the second slow-performing storage unit compares unfavorably to the second performance threshold value and compares favorably to the first performance threshold value.

In various embodiments, the plurality of data slices are generated by performing an encoding function on a data object to be written to storage, wherein a parameter of the encoding function is the size of the new storage unit write set, and wherein the number of data slices generated is equal to the size of the new storage unit write set. In various embodiments, an original plurality of data slices is generated by performing an encoding function on a data object to be written to storage, wherein the number of data slices generated is equal to the size of the original storage unit write set, wherein a subset of the original plurality of data slices to be written to storage is selected based on the new storage unit write set, and wherein the plurality of data slices to be written to corresponding storage units of the new storage unit write set corresponds to the data slices of the subset.

In various embodiments, the plurality of storage unit performance values from the original plurality of storage units of an original storage unit write set via the network. In various embodiments, a plurality of performance data requests are generated, each for transmission to one of the original plurality of storage units of the original storage unit write set via the network, and wherein the plurality of storage unit performance values are received in response to the plurality of performance data requests.

In various embodiments, generating the storage unit write set data is further based on a minimum write threshold, and wherein the size of the new storage unit write set is greater than or equal to the minimum write threshold. In various embodiments, the first storage unit performance data indicates a plurality of first slow-performing storage units with corresponding storage unit performance values that compare unfavorably to the first performance threshold value. A subset of the plurality of first slow-performing storage units is selected to remain in the new storage unit write set, wherein only the storage units of the plurality of first slow-performing storage units that are not included in the subset are removed from the original storage unit write set. The subset is selected based on the minimum write threshold, and the size of the new storage unit write set is equal to the minimum write threshold. In various embodiments, selecting the subset is further based on a ranking of storage unit performance values corresponding to the first plurality of slow-performing storage units.

In various embodiments, the first performance threshold value is selected based on at least one of: current system requirements or a record of past accesses. In various embodiments, the plurality of data slices correspond to a data object, and the first performance threshold value is selected based on a write urgency indicator associated with the data object.

In various embodiments, a non-transitory computer readable storage medium includes at least one memory section that stores operational instructions that, when executed by a processing system of a dispersed storage network (DSN) that includes a processor and a memory, causes the processing system to generate first storage unit performance data based on a first performance threshold value and a plurality of storage unit performance values corresponding to an original plurality of storage units of an original storage unit write set. Storage unit write set data is generated, indicating a new storage unit write set based on the first storage unit performance data, wherein at least one first slow-performing storage unit is removed from the original storage unit write set to create the new storage unit write set when the first storage unit performance data indicates that the at least one first slow-performing storage unit has an at least one corresponding storage unit performance value that compares unfavorably to the first performance threshold value. A plurality of write requests are generated for transmission to each of the storage units of the new storage unit write set via a network, wherein each write request includes one of a plurality of data slices to be written to a corresponding storage unit of the new storage unit write set.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a dispersed storage and task (DST) processing unit that includes a processor, the method comprises:
    generating first storage unit performance data based on a first performance threshold value and a plurality of storage unit performance values corresponding to an original plurality of storage units of an original storage unit write set;
    generating storage unit write set data indicating a new storage unit write set based on the first storage unit performance data, wherein at least one first slow-performing storage unit is removed from the original storage unit write set to create the new storage unit write set when the first storage unit performance data indicates that the at least one first slow-performing storage unit has an at least one corresponding storage unit performance value that compares unfavorably to the first performance threshold value;
    generating a plurality of write requests for transmission to each of the storage units of the new storage unit write set via a network, wherein each write request includes one of a plurality of data slices to be written to a corresponding storage unit of the new storage unit write set; and
    generating second storage unit performance data when the at least one first slow-performing storage unit has a corresponding storage unit performance value that compares unfavorably to the first performance threshold value, wherein the second storage unit performance data is based on a second performance threshold value that compares favorably to the first performance threshold value, and further based on the plurality of storage unit performance values;
    wherein generating the storage unit write set data further includes removing at least one second slow-performing storage unit from the original storage unit write set to create the new storage unit write set when the second storage unit performance data indicates that the at least one second slow-performing storage unit has an at least one corresponding storage unit value that compares unfavorably to the second performance threshold value.

2. The method of claim 1, wherein the at least one corresponding storage unit value the second slow-performing storage unit compares unfavorably to the second performance threshold value and compares favorably to the first performance threshold value.

3. The method of claim 1, wherein generating the storage unit write set data includes creating the new storage unit write set by including all of the storage units of the original storage unit write set when the first storage unit performance data indicates that all of the plurality of storage unit performance values compare favorably to the first threshold performance value.

4. The method of claim 1, further comprising generating the plurality of data slices by performing an encoding function on a data object to be written to storage, wherein a parameter of the encoding function is the size of the new storage unit write set, and wherein the number of data slices generated is equal to the size of the new storage unit write set.

5. The method of claim 1, further comprising generating an original plurality of data slices by performing an encoding function on a data object to be written to storage, wherein the number of data slices generated is equal to the size of the original storage unit write set, wherein a subset of the original plurality of data slices to be written to storage is selected based on the new storage unit write set, and wherein the plurality of data slices to be written to corresponding storage units of the new storage unit write set corresponds to the data slices of the subset.

6. The method of claim 1, further comprising receiving the plurality of storage unit performance values from the original plurality of storage units of an original storage unit write set via the network.

7. The method of claim 6, further comprising generating a plurality of performance data requests, each for transmission to one of the original plurality of storage units of the original storage unit write set via the network, and wherein the plurality of storage unit performance values are received in response to the plurality of performance data requests.

8. The method of claim 1, wherein generating the storage unit write set data is further based on a minimum write threshold, and wherein the size of the new storage unit write set is greater than or equal to the minimum write threshold.

9. The method of claim 8, wherein the first storage unit performance data indicates a plurality of first slow-performing storage units with corresponding storage unit performance values that compare unfavorably to the first performance threshold value, wherein a subset of the plurality of first slow-performing storage units is selected to remain in the new storage unit write set, wherein only the storage units of the plurality of first slow-performing storage units that are not included in the subset are removed from the original storage unit write set, wherein the subset is selected based on the minimum write threshold, and wherein the size of the new storage unit write set is equal to the minimum write threshold.

10. The method of claim 9, wherein selecting the subset is further based on a ranking of storage unit performance values corresponding to the first plurality of slow-performing storage units.

11. The method of claim 1, further comprising selecting the first performance threshold value based on at least one of: current system requirements or a record of past accesses.

12. The method of claim 1, wherein the plurality of data slices correspond to a data object, further comprising selecting the first performance threshold value based on a write urgency indicator associated with the data object.

13. A processing system of a dispersed storage and task (DST) processing unit comprises:
at least one processor;
a memory that stores operational instructions, that when executed by the at least one processor cause the processing system to:
generate first storage unit performance data based on a first performance threshold value and a plurality of storage unit performance values corresponding to an original plurality of storage units of an original storage unit write set;
generate storage unit write set data indicating a new storage unit write set based on the first storage unit performance data, wherein at least one first slow-performing storage unit is removed from the original storage unit write set to create the new storage unit write set when the first storage unit performance data indicates that the at least one first slow-performing storage unit has an at least one corresponding storage unit performance value that compares unfavorably to the first performance threshold value;
generate a plurality of write requests for transmission to each of the storage units of the new storage unit write set via a network, wherein each write request includes one of a plurality of data slices to be written to a corresponding storage unit of the new storage unit write set; and
generate second storage unit performance data when the at least one first slow-performing storage unit has a corresponding storage unit performance value that compare unfavorably to the first performance threshold value, wherein the second storage unit performance data is based on a second performance threshold value that compares favorably to the first performance threshold value, and further based on the plurality of storage unit performance values;
wherein generating the storage unit write set data further includes removing at least one second slow-performing storage unit from the original storage unit write set to create the new storage unit write set when the second storage unit performance data indicates that the at least one second slow-performing storage unit has an at least one corresponding storage unit value that compares unfavorably to the second performance threshold value.

14. The processing system of claim 13, wherein the at least one corresponding storage unit value the second slow-performing storage unit compares unfavorably to the second performance threshold value and compares favorably to the first performance threshold value.

15. The processing system of claim 13, wherein generating the storage unit write set data includes creating the new storage unit write set by including all of the storage units of the original storage unit write set when the first storage unit performance data indicates that all of the plurality of storage unit performance values compare favorably to the first threshold performance value.

16. The processing system of claim 13, wherein generating the storage unit write set data is further based on a minimum write threshold, and wherein the size of the new storage unit write set is greater than or equal to the minimum write threshold.

17. The processing system of claim 16, wherein the first storage unit performance data indicates a plurality of first slow-performing storage units with corresponding storage unit performance values that compare unfavorably to the first performance threshold value, wherein a subset of the plurality of first slow-performing storage units is selected to remain in the new storage unit write set, wherein only the storage units of the plurality of first slow-performing storage units that are not included in the subset are removed from the original storage unit write set, wherein the subset is selected based on the minimum write threshold, and wherein the size of the new storage unit write set is equal to the minimum write threshold.

18. A non-transitory computer readable storage medium comprises:
at least one memory section that stores operational instructions that, when executed by a processing system of a dispersed storage network (DSN) that includes a processor and a memory, causes the processing system to:
generate first storage unit performance data based on a first performance threshold value and a plurality of storage unit performance values corresponding to an original plurality of storage units of an original storage unit write set;
generate storage unit write set data indicating a new storage unit write set based on the first storage unit performance data, wherein at least one first slow-performing storage unit is removed from the original storage unit write set to create the new storage unit write set when the first storage unit performance data indicates that the at least one first slow-performing storage unit has an at least one corresponding storage unit performance value that compares unfavorably to the first performance threshold value;
generate a plurality of write requests for transmission to each of the storage units of the new storage unit write set via a network, wherein each write request includes one of a plurality of data slices to be written to a corresponding storage unit of the new storage unit write set; and
generate second storage unit performance data when the at least one first slow-performing storage unit has a corresponding storage unit performance value that compare unfavorably to the first performance threshold value, wherein the second storage unit performance data is based on a second performance threshold value that compares favorably to the first performance threshold value, and further based on the plurality of storage unit performance values;
wherein generating the storage unit write set data further includes removing at least one second slow-performing storage unit from the original storage unit write set to create the new storage unit write set when the second storage unit performance data indicates that the at least one second slow-performing storage unit has an at least one corresponding storage unit value that compares unfavorably to the second performance threshold value.

* * * * *